United States Patent [19]
Kato et al.

[11] Patent Number: 6,155,542
[45] Date of Patent: Dec. 5, 2000

[54] VIBRATION DAMPING APPARATUS AND METHOD

[75] Inventors: Hiroaki Kato; Takehiko Mayama, both of Utsunomiya, Japan

[73] Assignee: Canon Kabushiki Kaisha, Tokyo, Japan

[21] Appl. No.: 08/773,010

[22] Filed: Mar. 10, 1997

[30] Foreign Application Priority Data

Jan. 5, 1996 [JP] Japan .................................. 8-017093

[51] Int. Cl.$^7$ .................................................. H01L 21/30
[52] U.S. Cl. ........................................ 267/136; 188/378
[58] Field of Search ..................... 267/140.11, 140.13, 267/140.14, 140.15, 136, DIG. 1–DIG. 2; 188/378–381; 248/550

[56] References Cited

U.S. PATENT DOCUMENTS 5,653,317  8/1997  Wakui .................................... 267/136
5,660,255  8/1997  Schubert et al. ...................... 267/136

FOREIGN PATENT DOCUMENTS 7-083276  3/1995  Japan .

*Primary Examiner*—Matthew C. Graham
*Attorney, Agent, or Firm*—Fitzpatrick, Cella, Harper & Scinto

[57] ABSTRACT

A vibration damping apparatus includes a plurality of actuators for removing vibration of a table as an object of vibration damping, a detection device for detecting a vibration status of the table, an acquisition device for acquiring compensation amounts for a plurality of directional elements, from the vibration status detected by the detection device, and an allocation device for allocating an actuator-driving force corresponding to a compensation amount for a predetermined directional element, among the compensation amounts acquired by the acquisition device, to an actuator having a small amount of driving force, allocated based on a compensation amount for another directional element.

5 Claims, 5 Drawing Sheets

VIBRATION DAMPING APPARATUS AND METHOD

BACKGROUND OF THE INVENTION

This invention relates to a vibration damping apparatus having air springs, linear motors and the like, used as a quadruped support mechanism especially in a semiconductor exposure apparatus.

With the improvement of precision devices such as an electronic microscope and a semiconductor exposure device, there is a need for a high-performance precision vibration-damping apparatus mounting these precision devices. Especially, in the semiconductor exposure device, a table for damping as much as possible extraneous vibration such as vibration transmitted from a setting floor is necessary for appropriate and quick exposure, since an XY stage for exposure must be completely stopped when a semiconductor wafer is exposed. The XY stage is characterized by intermittent operation, referred to as a step & repeat operation, which causes vibration of the table itself. Accordingly, in the table, it is required to implement both vibration damping performances against extraneous vibration and internal vibration caused by the operation of a device mounted on the table.

Regarding this requirement, an active vibration damping apparatus which detects vibration of a table with vibration sensors and imparts driving forces upon a table in accordance with output signals from the sensors, has been introduced into practical use.

FIG. 6 shows the construction of the vibration damping apparatus. A table 8 holding an XY stage 17 is supported by four vibration damping units as a quadruped vibration damping apparatus. The vibration damping units are provided at the four corners of the table 8. The respective vibration damping units have the same construction. Therefore, they have the same reference number with different letter suffixes. A vibration damping unit 1a comprises a horizontal actuator 2a which applies a driving force in a horizontal direction to the table 8, a horizontal acceleration sensor 4a and a horizontal position sensor 5a for detecting horizontal vibration of the table 8, a vertical actuator 3a which applies a driving force in a vertical direction upon the table 8, and a vertical acceleration sensor 6a and a vertical position sensor 7a for detecting vertical vibration of the table 8. In practice, the vibration damping unit 1a may include parts not shown in the figure, for example, a servo valve for supplying air as an operating fluid if the actuators 2a and 3a are air springs, or mechanical springs. However, FIG. 6 illustrates conceptually the construction of the vibration damping apparatus, and it only shows representative parts of essential constituent elements for vibration control of the table 8. As described above, the other vibration damping units 1b to 1d have the same construction. Note that in one of the vibration damping units 1a to 1d, the horizontal and vertical position sensors may be omitted.

As a control method for controlling the active vibration damping apparatus, motion-mode based control is disclosed in Japanese Patent Application Laid-Open No. 7-83276. This control extracts motion modes regarding the accelerations of the table and motion modes regarding the positions of the table from signals from a plurality of acceleration sensors and position sensors, and performs appropriate compensation in each motion mode.

According to this motion-mode based control, six degrees of freedom of rigid-body motion of the table are classified into three horizontal degrees of freedom (two degrees of freedom in the horizontal X- and Y-axial directions, and a rotational degree of freedom around a vertical Z axis), and three vertical degrees of freedom (a degree of freedom in the Z-axial direction, and two degrees of freedom around the X- and Y-axial directions). Then, vibration control is made in accordance with each motion mode.

In the construction of the active vibration damping apparatus shown in FIG. 6, the number of the horizontal actuators 2a to 2d and that of the vertical actuators 3a to 3d are four corresponding to the number of the vibration damping units as support mechanisms. Therefore, there are three degrees of freedom with respect to the horizontal and vertical motion modes, while the number of the actuators is redundant. Accordingly, there are a plurality of ways for vertical motion-mode distributors 11 and 11' and horizontal motion-mode distributors 12 and 12' to distribute motion-mode based table driving forces to the respective actuators.

In the semiconductor-exposure apparatus, the XY stage 17 mounted on the table 8 is characterized by its intermittent step & repeat operation. The repetitive step operation is generally made in the X- or Y-direction of the XY stage 17. Some of the horizontal actuators 2a to 2d which generate driving forces in the step-operation direction receive heavy loads since vibration of the table upon step & repeat operation is suppressed. Considering the structural feature of the table 8, its center of gravity does not always correspond to the central position of arrangement of the vibration damping units 1a to 1d. The table 8 is float-supported by the vibration damping units 1a to 1d for shutting off the vibration table 8 from vibration of the setting floor. In this state, the vertical actuators 3a to 3d constantly receive loads greater than those upon the actuators positioned closer to the center of gravity of the structure (the table 8 and the XY stage 17 in this case). In this manner, the structure and operation of the device mounted on the vibration damping apparatus cause a variety of loads upon the horizontal and vertical actuators.

Since the actuator cannot generate an infinite driving force, an actuator that receives a heavy load cannot generate a driving force corresponding to an output signal from the motion-mode distributor, which causes a so-called actuator-output saturation. If the actuator has a sufficiently large output, such a phenomenon does not occur. However, the artifact supported by the vibration damping apparatus in a semiconductor exposure device generally has a large weight. Further, it is desired that the speed of the step operation of the XY stage be increased so as to improve the throughput of the semiconductor device. Therefore, the table 8 receives a large counter force from the XY-stage driving. If a large-output actuator which has a sufficient performance to meet these conditions is used, the size of the vibration damping apparatus is increased. Then the size of the semiconductor exposure device itself is increased in size and weight. In addition, this is disadvantageous in the point of costs. Accordingly, actuator-output saturation cannot be avoided if loads are concentrated on a part of the actuators.

When actuator-output saturation occurs in the motion-mode based control, a predetermined driving force cannot act upon the table 8 based on each motion mode, which disturbs the motion-mode based control. To realize appropriate and effective motion-mode based control, actuator-output saturation must be avoided. Otherwise, even if the actuator-output saturation does not occur, the concentration of loads upon a part of the actuators should be avoided in consideration of durability. For this purpose, it is necessary to design the motion-mode distributors so as to distribute the table driving force without concentrating loads on a portion of the actuators, utilizing the fact that the horizontal motion modes and vertical motion modes of the table 8 are respectively three, whereas the number of the horizontal actuators 2a to 2d and that of the vertical actuators 3a to 3d are redundant.

SUMMARY OF THE INVENTION

Accordingly, it is an object of the present invention to provide, by utilizing redundant actuators, an active vibration damping apparatus having motion-mode distributors which distribute driving forces without concentrating loads on a portion of the actuators, thus realizing appropriate and effective motion-mode based control.

According to one aspect of the present invention, horizontal motion-mode distributors output actuator driving-force signals, based on an input signal indicative of a rotational degree of freedom around a vertical axis, to only two actuators which generate driving forces in an X direction of an XY stage mounted on a table, or only two actuators which generate driving forces in a Y direction of the XY stage. When the XY stage performs step & repeat operation, parallel-propulsive vibration in the step-operation direction of the XY stage is generated at the table. This causes heavy loads upon two of the actuators which generate driving forces in the step-operation direction. The above horizontal motion-mode distributors do not output the actuator driving-force signals based on the input signal indicative of the rotational direction to two of the actuators which receive heavy loads, thus preventing actuator-output saturation.

Further, the horizontal motion-mode distributors output actuator driving-force signals based on an input signal of a parallel-propulsive degree of freedom in the X-direction of the XY stage, equally to two of the actuators which generate driving forces in the X-direction of the XY stage; otherwise, the horizontal motion-mode distributors output actuator driving-force signals based on a parallel-propulsive degree of freedom in the Y-direction of the XY stage, equally to two of the actuators which generate driving forces in the Y-direction of the XY stage. When the XY stage performs step & repeat operation, a large amount of vibration damping force in the step-operation direction must be acted upon the table. By equally distributing the damping force into two of the actuators, the concentration of loads upon one actuator can be prevented.

Vertical motion-mode distributors output actuator driving-force signals based on an input signal of two rotational degrees of freedom around the horizontal orthogonal two axes or a vertical parallel-propulsive degree of freedom, by comparing signals to two of the actuators positioned closer to the center of gravity of the vibration damping apparatus with signals to the other two actuators, so that the two actuators closer to the center of gravity will receive a reduced signal. As described above, the device supported by the vibration damping apparatus in a semiconductor exposure apparatus has a large weight. Therefore, the actuators provided closer to the center of gravity of the table always receive a heavy load. Generally, with respect to the actuator closer to the center of gravity, which always receives a heavy load, the above vertical motion-mode distributor suppresses an actuator driving-force signal based on an input signal of a rotational degree of freedom, to a lower value. This prevents actuator-output saturation. Accordingly, the present invention realizes appropriate and effective motion-mode based control.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

First Embodiment

Figure 1:
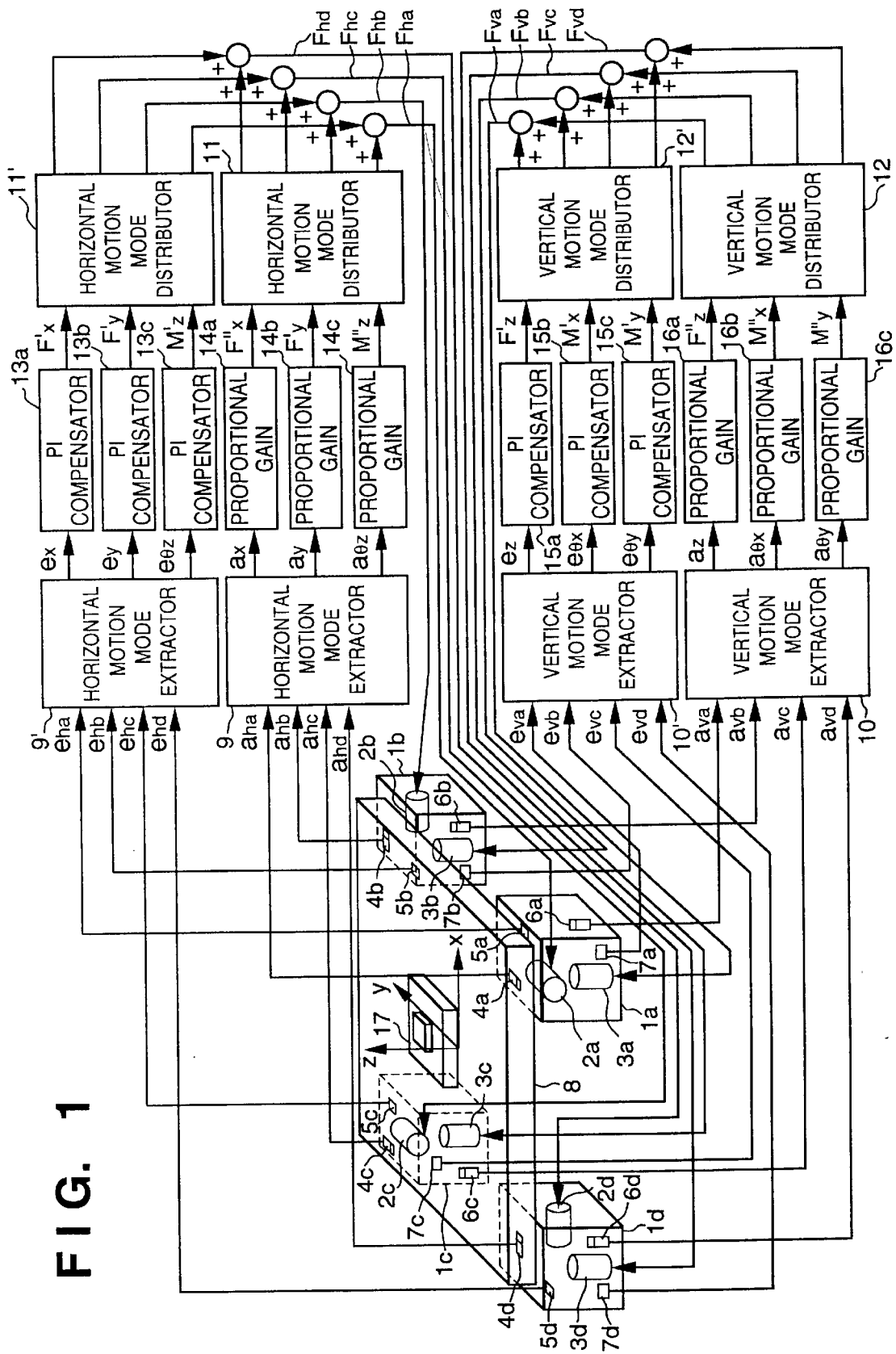
FIG. 1 is a block diagram showing the construction of a vibration damping apparatus according to a first embodiment of the present invention.
Figure 6:
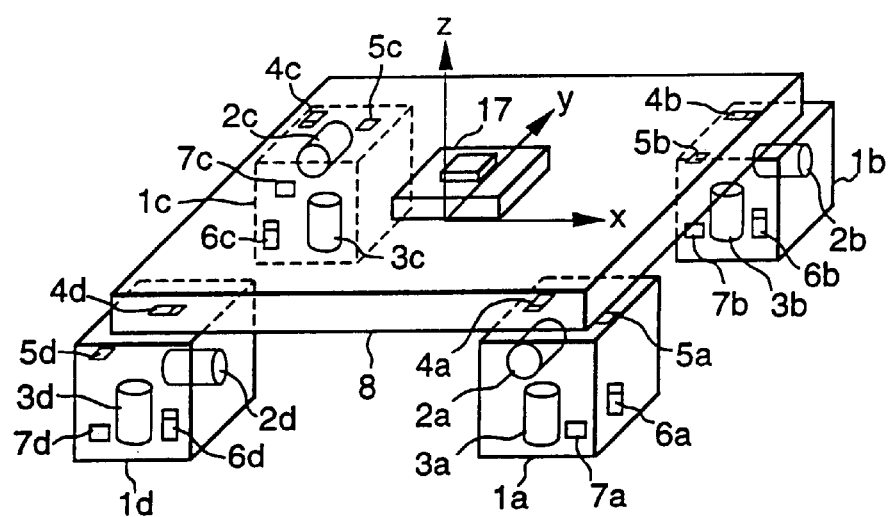
FIG. 6 is a perspective view showing a general construction of a conventional active vibration damping apparatus.

FIG. 1 is a block diagram showing the construction of a vibration damping apparatus according to a first embodiment of the present invention. In FIG. 1, elements such as a table, actuators, position sensors and acceleration sensors corresponding to those in FIG. 6 have the same reference numerals.

If the table 8 is regarded as a rigid body, its rigid-body motion can be classified into six degrees of freedom, more specifically, three parallel-propulsive degrees of freedom and three rotational degrees of freedom. When the xyz orthogonal coordinate system is fixed onto the table 8 so that the origin of the coordinate system corresponds with the center of gravity of the table 8, and that the z-axis direction corresponds with the vertical direction, the rigid-body motion of the table 8 can be classified into six motion modes, more specifically, three horizontal degree-of-freedom motion modes, i.e., an x-directional parallel-propulsive degree of freedom, a y-directional parallel-propulsive degree of freedom, and a rotational degree of freedom around the z-axis, and three vertical degree-of-freedom motion modes, i.e., a z-directional parallel-propulsive degree of freedom, a rotational degree of freedom around the x-axis, and a rotational degree of freedom around the y-axis. If the horizontal acceleration sensors and horizontal position sensors included in the respective vibration damping units are included in or around an xy plane of the xyz coordinate system, i.e., the sensors are included in or around a horizontal plane passing the center of gravity of the table 8, the three horizontal degree-of-freedom motion modes regarding accelerations of the table 8 and the three horizontal degree-of-freedom motion modes regarding position of the table 8 can be respectively extracted from signals from the horizontal acceleration sensors and horizontal position sensors regarding the positions in the respective vibration damping units. Also, the three vertical degree-of-freedom motion modes regarding the accelerations of the table 8 and the three vertical degree-of-freedom motion modes regarding the positions of the table 8 can be respectively extracted from signals from the vertical acceleration sensors and vertical position sensors regarding the positions in the respective vibration damping units.

In FIG. 1, a horizontal motion-mode extractor 9 extracts horizontal motion-modes $a_x$, $a_y$ and $a_{\theta z}$ regarding the accelerations, from signals $a_{ha}$, $a_{hb}$, $a_{hc}$ and $a_{hd}$ from the horizontal acceleration sensors 4a to 4d, respectively, regarding the positions, included in the vibration damping units 1a to 1d constructing a quadruped vibration damping apparatus. Generally, the active vibration damping apparatus has a positioning function for the table 8. Accordingly, a horizontal motion-mode extractor 9' extracts horizontal motion-modes $e_x$, $e_y$ and $e_{\theta z}$ regarding the positions, from position deviation signals $e_{ha}$, $e_{hb}$, $e_{hc}$ and $e_{hd}$. The position deviation signals $e_{ha}$ to $e_{hd}$ are obtained from comparison and subtraction of signals from the horizontal position sensors 5a to 5d, respectively, regarding the positions, included in the vibration damping units 1a to 1d, from target position signals. The horizontal motion modes $e_x$, $e_y$ and $e_{\theta z}$ regarding the positions indicate the respective positional deviations of the horizontal motion modes. The horizontal motion-mode extractors 9 and 9' output the horizontal degree-of-freedom motion modes, from the input signals from three or more sensors.

Regarding the vertical direction, similar motion-mode extraction is performed. A vertical motion-mode extractor 10 extracts vertical motion-modes $a_z$, $a_{\theta x}$, and $a_{\theta y}$ regarding the accelerations, from signals $a_{va}$, $a_{vb}$, $a_{vc}$ and $a_{vd}$ from the vertical acceleration sensors 6a to 6d, respectively, regarding the positions, included in the vibration damping units 1a to 1d. A vertical motion-mode extractor 10' extracts vertical motion-modes $e_z$, $e_{\theta x}$ and $e_{\theta y}$ regarding the positions, from position deviation signals $e_{va}$, $e_{vb}$, $e_{vc}$ and $e_{vd}$. The position deviation signals $e_{va}$ to $e_{vd}$ are obtained from comparison and subtraction of signals from the vertical position sensors 7a, 7b, 7c and 7d, respectively, regarding the positions in the vibration damping units 1a to 1d, from target position signals. The vertical motion modes $e_z$, $e_{\theta x}$ and $e_{\theta y}$ regarding the positions indicate the respective positional deviations of the vertical motion modes. The vertical motion-mode extractors 10 and 10' output the vertical degree-of-freedom motion modes, from the input signals from three or more sensors.

Next, an appropriate compensation is performed on the outputs from the motion-mode extractors, to generate motion-mode based table driving forces regarding the accelerations and positions. If air springs are employed as the actuators, proportional gains are desirable as compensators which act on the outputs from the motion-mode extractor regarding the accelerations. As compensators which act on the outputs from the motion-mode extractor regarding the positions, PI (P: proportional operation, I: integration) compensators are desirable for converging the positional deviations in normal status into zero. In FIG. 1, regarding the horizontal direction, proportional gains 14a, 14b and 14c are acted on the motion modes $a_x$, $a_y$ and $a_{\theta z}$ regarding the accelerations, to generate motion-mode based table driving forces $F''_x$, $F''_y$ and $M''_z$ regarding the accelerations (F: parallel-propulsive force, M: rotational moment) while PI compensators 13a, 13b and 13c are acted on the motion modes $e_x$, $e_y$ and $e_{\theta z}$ regarding the positions, to generate motion-mode based table driving forces $F'_x$, $F'_y$ and $M'_z$ regarding the positions. Regarding the vertical direction, proportional gains 16a, 16b and 16c are acted on the motion modes $a_z$, $a_{\theta x}$ and $a_{\theta y}$ regarding the accelerations, to generate motion-mode based table-riving forces $F''_z$, $M''_x$ and $M''_y$ regarding the accelerations, while PI compensators 15a, 15b and 15c are acted on the motion modes $e_z$, $e_{\theta x}$ and $e_{\theta y}$ regarding the positions to generate motion-mode based table driving forces $F'_z$, $M'_x$ and $M'_y$ regarding the positions.

The motion-mode based table driving forces are distributed to the respective actuators. If the horizontal actuators 2a to 2d in the respective vibration damping units are included in or around the horizontal plane passing the center of gravity of the table 8, the horizontal motion-mode based table driving forces $F''_x$, $F''_y$, $M''_z$, $F'_x$, $F'_y$ and $M'_z$ are distributed to the horizontal actuators 2a to 2d, while the vertical motion-mode based table driving forces $F''_z$, $M''_x$, $M''_y$, $F'_z$, $M'_x$ and $M'_y$ are distributed to the vertical actuators 3a to 3d. In FIG. 1, the sums of the outputs from the horizontal motion-mode distributor 11 that distributes the horizontal motion-mode based table driving forces $F''_x$, $F''_y$ and $M''_z$ regarding the accelerations to the horizontal actuators 2a to 2d, and the outputs from the horizontal motion-mode distributor 11' that distributes the horizontal motion-mode based table driving forces $F'_x$, $F'_y$ and $M'_z$ regarding the positions to the horizontal actuators 2a to 2d, respectively, become driving-force signals $F_{ha}$, $F_{hb}$, $F_{hc}$ and $F_{hd}$ to the horizontal actuators 2a to 2d.

Similarly, the sums of the outputs from the vertical motion-mode distributor 12 that distributes the vertical motion-mode based table driving forces $F''_z$. $M''_x$ and $M''_y$ regarding the accelerations to the vertical actuators 3a to 3d, and the outputs from the vertical motion-mode distributor 12' that distributes the vertical motion-mode based table driving forces $F'_z$, $M'_x$ and $M'_y$ regarding the positions to the vertical actuators 3a to 3d, respectively, become driving-force signals $F_{va}$, $F_{vb}$, $F_{vc}$ and $F_{vd}$ to the horizontal actuators 3a to 3d.

As described above, the active vibration damping apparatus, provided with motion-mode based control performs, regarding table positions, appropriately compensated attitude control by motion mode, and regarding acceleration, appropriate damping by motion mode. Further, with respect to the rigid-body motion of the table 8 comprising six degrees of freedom, motion-mode based control can be performed for three horizontal degree-of-freedom motion modes and three vertical degree-of freedom motion modes.

Assuming that the motion-mode based table driving force, as an input of the motion-mode distributor (11, 11', 12 and 12'), is vector b, and the actuator driving force signal as its output is vector x, the order of the vector b corresponds to the degree of freedom p of the table motion mode; and the order of the vector x, with the number q of the actuators (b $\in R^p$, x $\in R^q$). The relation between the vectors b and x is represented as follows, by the arrangement of the actuators with respect to the center of gravity of the artifact supported by the vibration damping apparatus:

$$Ax = b \tag{1}$$

The matrix $A \in R^{p \times q}$ according to the left side of equation (1) is a constant matrix determined by the arrangement of the actuators. Equation (1) is a basic representation of the motion mode distribution. The present invention is directed to a vibration damping apparatus having a redundant number of actuators with respect to the degrees of freedom of the motion modes of the table, therefore, q>p holds. The actuator-driving force signal x, which satisfies equation (1) when the motion-mode based table driving force b is given, has more than one solution. The solution of the simultaneous linear equations is the sum of one particular solution of equation (1) and a general solution $y \in R^q$ of the following equation (2).

$$Ax=0 \quad (2)$$

As the actuators are arranged so as to impart a driving force in each of the motion modes, equation (1) has solutions, and the matrix A has a full rank (rank A=p). At this time, a general solution y of equation (2) forms a vector space with an order (q-p). One of the particular solutions of equation (1) can be obtained by a pseudo inverse matrix A# of the matrix A. By using the pseudo inverse matrix A# and the general solution y, the solution x of the motion-mode distribution basic representation (1) is:

$$x = A\#b + y \quad (3)$$

The general solution y of equation (2) is appropriately set so as to prevent the motion-mode based control from being disturbed by actuator-output saturation. This determines the actuator-driving force signal x with respect to the motion-mode table driving force b. As equation (3) in the above form cannot be used for setting the solution y, equation (3) is transformed as follows.

Assuming that the basis vectors of the solution space formed with the solution y are $y_1, y_2, \ldots, y_{q-p}$, the solution y is represented as linear combinations of basis vectors:

$$y = (h_1^T b)y_1 + (h_2^T b)y_2 + \ldots + (h_{q-p}^T b)y_{q-p} \quad (4)$$

$h_1, h_2, \ldots, h_{q-p} \in R^p$ denote arbitrary vectors, and T, transposition. In equation (4), the basis vectors have arbitrary scalar amounts. Therefore, this equation in this form can include the motion-mode based table driving force b. From equations (3) and (4), the following equations can be obtained:

$$x = \left[ (A^\#)_1 + \sum_{i=1}^{q-p} (hi)_1 yi (A^\#)_2 + \sum_{i=1}^{q-p} (hi)_2 yi \ldots (A^\#)_p + \sum_{i=1}^{q-p} (hi)_p yi \right] b$$

$$A\# = [(A\#)_1 (A\#)_2 \ldots (A\#)_p] \quad (6)$$

$$h_i = [(h_i)_1 (h_i)_2 \ldots (h_i)_p]^T (i=1, 2, \ldots, q-p) \quad (7)$$

In equations (5) to (7), $(A\#)_i$(i=1, 2, ..., p) represents the i-th column vector of the matrix A#; and $(h_i)_j$, the j-th factor (j=1, 2, ..., p) of arbitrary vector $h_i$(i=1, 2, ..., q-p).

As it is understood from equation (5), the actuator driving force signal x is represented as a first-order linear equation of the motion-mode based table driving force b. The coefficient matrix according to the motion-mode based table driving force b is determined with respect to each column vector, using the arbitrary amount $(h_i)_j$ as a parameter. This means that the motion-mode distribution equation can be determined with respect to each motion mode. Hereinafter, the arbitrary amount $(h_i)_j$ will be referred to as a "motion-mode distribution parameter". Among the solutions x which satisfy the motion-mode distribution basic equation (1), the least norm |x| of the solutions themselves is x=A#b. In equation (5), this holds when all the motion-mode distribution parameters $(h_i)_j$ are "0". That is, when all the arbitrary parameters $(h_i)_j$ are "0", motion-mode distribution is realized with the least total sum $$\sum_{i=1}^{q} |x|$$

of driving forces to be generated by the respective actuators with respect to given motion-mode based table driving forces b. This distribution is reasonable from the point of minimizing energy, so far as actuator-output saturation does not occur and the respective actuators have sufficient output. However, upon step-operation of the XY stage, if there is a strong probability of actuator-output saturation by concentrated loads upon an actuator that generates a driving force in the step-operation direction, the motion-mode distribution parameters $(h_i)^j$ can be manipulated to dissolve the actuator-output saturation, to appropriately realize the motion-mode based control.

Figure 2:
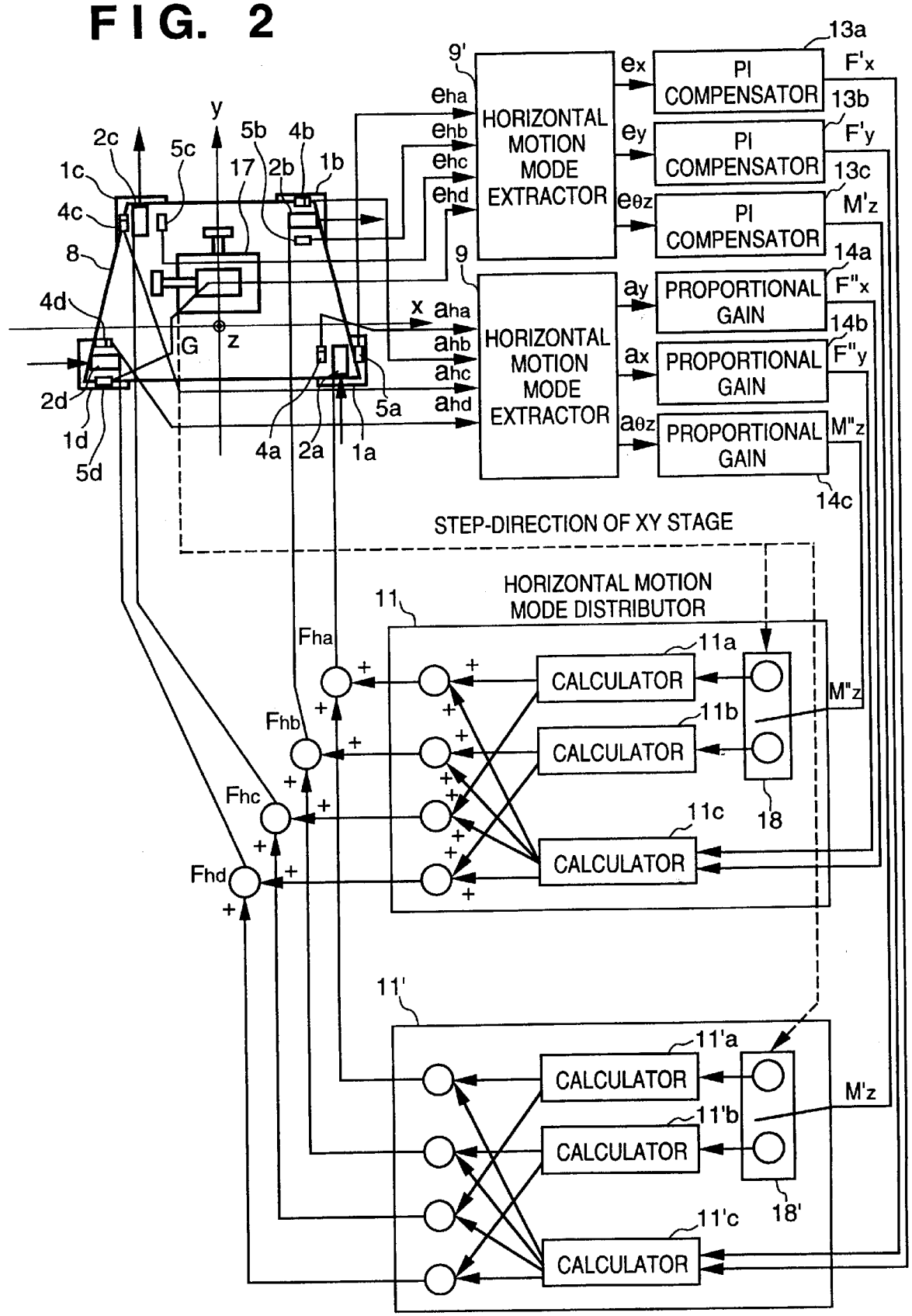
FIG. 2 is a block diagram showing a horizontal vibration-damping structure of the vibration damping apparatus of the first embodiment.
Figure 4:
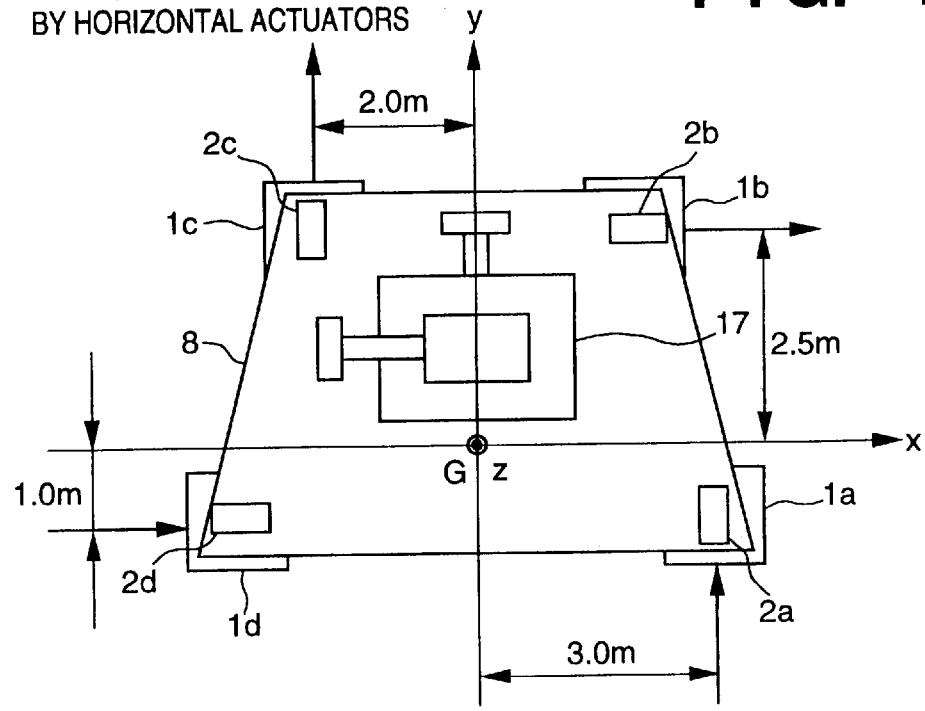
FIG. 4 is a schematic perspective view showing the arrangement of horizontal actuators according to the first embodiment.

FIG. 2 is a block diagram showing a horizontal vibration-damping structure of the vibration damping apparatus of the embodiment. In FIG. 2, assuming the horizontal actuators 2a to 2d, the horizontal acceleration sensors 4a to 4d, and the horizontal position sensors 5a to 5d are provided close to the plane passing the center of gravity of the table 8, motion-mode based control with respect to three horizontal degree-of-freedom motion modes, i.e., horizontal parallel-propulsive two degrees of freedom and a horizontal rotational degree of freedom around the vertical axis, with respect to six degrees of freedom are performed as the original motion modes of the table 8. As shown in FIG. 2, when the orthogonal coordinate system is fixed to the table 8 so that the origin of the coordinate system corresponds with the center of gravity G of the table 8, the z-axis, with the vertical axis, and the x-axis, with the lengthwise direction of the table 8, the horizontal motion modes of the table 8 are three motion modes, i.e., a parallel-propulsive degree of freedom in the x-axial direction, a parallel-propulsive degree of freedom in the y-axial direction, and a rotational degree of freedom around the z-axis (θz). The actuators are arranged such that the actuators 2a and 2c generate y-directional driving forces, while the actuators 2b and 2d generate x-directional driving forces. The distances between a driving-force acting point on the table 8 and the x-axis and the y-axis are as shown in FIG. 4.

In this case, the basis motion-mode distribution representation is:

$$\begin{bmatrix} 0 & 1 & 0 & 1 \\ 1 & 0 & 1 & 0 \\ 3.0 & -2.5 & -2.0 & -1.0 \end{bmatrix} \begin{bmatrix} F_{ha} \\ F_{hb} \\ F_{hc} \\ F_{hd} \end{bmatrix} = \begin{bmatrix} F_x \\ F_y \\ M_z \end{bmatrix} \quad (8)$$

The motion-mode based table driving forces are $[F_x, F_y, M_z]^T \in R^3$, and the actuator driving force signals, $[F_{ha}, F_{hb}, F_{hc}, F_{hd}]^T \in R^4$. $F_x$ and $F_y$ respectively denote an x-axial direction parallel-propulsive force and a y-axial direction parallel-propulsive force; Mz, a moment around the z-axis; $F_{ha}$ to $F_{hd}$, the actuator driving force signals to the horizontal actuators 2a to 2d. As the coefficient matrix of equation (8) is full rank, equation (8) has solutions with respect to the arbitrary motion-mode based table driving forces $[F_x, F_y, M_z]^T$, and the solutions of the simultaneous equations form a first-order vector space. Equation (9) is a general motion-mode distribution representation of the horizontal motion-mode based control as the solution of equation (8):

$$\begin{bmatrix} F_{ha} \\ F_{hb} \\ F_{hc} \\ F_{hd} \end{bmatrix} = \begin{bmatrix} 0.100 - 3.5h_x & 0.433 - 3.5h_y & 0.134 - 3.5h_z \\ 0.430 - 5.0h_x & 0.047 - 5.0h_y & -0.094 - 5.0h_z \\ -0.100 + 3.5h_x & 0.567 + 3.5h_y & -0.134 + 3.5h_z \\ 0.571 + 5.0h_x & -0.047 + 5.0h_y & 0.094 + 5.0h_z \end{bmatrix} \begin{bmatrix} F_x \\ F_y \\ M_z \end{bmatrix} \quad (9)$$

In equation (9), $h_x$, $h_y$ and $h_z$ denote motion-mode distribution parameters used to determine motion-mode distribution with respect to each of the motion-mode based table driving forces $F_x$, $F_y$ and $M_z$. Each motion-mode table driving force has one degree of freedom, corresponding to the order of the solution space of equation (8).

In the horizontal vibration-damping structure in FIG. 2, the sums of the outputs from the horizontal motion-mode distributor 11 regarding the accelerations and outputs from the horizontal motion-mode distributor 11' regarding the positions are used as the actuator driving force signals. As equations (8) and (9) both can be used for both the horizontal motion-mode distributors 11 and 11', the motion-mode based table driving forces $F_x$, $F_y$ and $M_z$ in these equations are replaced with the acceleration-related motion-mode table driving forces $F''_x$, $F''_y$ and $M''_z$ or position-related table driving forces $F'_x$, $F'_y$ and $M'_z$ in the active vibration damping apparatus in FIG. 2. In this case, the actuator driving force signals $F_{ha}$ to $F_{hd}$ denote the outputs from any of the horizontal motion-mode distributors 11 and 11'. The signals actually outputted to the actuators are the sums of the outputs from the horizontal motion-mode distributors 11 and 11'. The motion-mode distribution can be respectively determined with respect to the accelerations and positions. Otherwise, if the sums between the motion-mode based table driving forces regarding the accelerations and the motion-mode based table driving forces regarding the positions are obtained prior to the motion-distribution stage, one of the motion-mode distributors can be omitted. In this case, the motion-mode based table driving forces $F_x$, $F_y$ and $M_z$ of equations (8) and (9) denote the sums between the motion-mode based table driving forces $F''_x$, $F''_y$, $M''_z$ and the motion mode based table driving forces $F'_x$, $F'_y$, $M'_z$. The actuator driving force signals $F_{ha}$ to $F_{hd}$ are used as commands to the actuators.

Next, the motion-mode distribution of the moment $M_z$ around the z-axis in the motion-mode distribution in equation (9) will be considered. As it is understood from the coefficient column vector according to the moment $M_z$, whatever value the motion-mode distribution parameter $h_z$ takes, the motion-mode distribution in the pair of actuators 2a and 2c, and that in the pair of actuators 2b and 2d have the same amount with inversed signs. The distribution ratios to the pair of actuators 2a and 2c and the pair of actuators 2b and 2d can be arbitrarily set. The actuators 2a and 2c generate driving forces in the y-axial direction, while the actuators 2b and 2d generate driving forces in the x-axial direction. This means that the moment $M_z$ around the z-axis can be distributed to the actuators which generate driving forces in the x-axial direction and to the actuators which generate driving forces in the y-axial direction at an arbitrary ratio.

The exposure XY stage is characterized by the intermittent step & repeat operation. As described above, upon a step-operation of the XY stage, to suppress vibration of the table 8 caused by a counter force from driving the stage, a large amount of vibration damping force in the step-operation direction of the XY stage must be acted upon the table 8. This causes heavy loads on the actuators that generate driving forces in the step-operation direction of the XY stage 17. Assuming that the side where the actuators 2a and 2d are provided is the front as shown in FIG. 2, the step & repeat operation of the XY stage 17 is generally made in the x- or y-axial direction in FIG. 2. Accordingly, when the XY stage 17 makes a step-operation in the x-axial direction, a large amount of vibration damping force must be acted on the x-axial parallel-propulsive motion mode of the table 8. Referring to the motion-mode distribution in equation (9), the x-axial parallel-propulsive force $F_x$ is mainly distributed to the actuators 2b and 2d that generate driving forces in the x-axial direction. Further, if the moment $M_z$ around the z-axis to suppress yawing vibration (rotational vibration around the z-axis) of the table 8 is distributed to the heavily-loaded actuators 2b and 2d, there is a possibility that saturation of the output of the actuators 2b and 2d occurs to disturb the motion-mode based control. The moment $M_z$ around the z-axis can be distributed to the actuators 2b and 2d that generate driving forces in the x-axial direction and to the actuators 2a and 2c that generate a driving force in the y-axial direction in an arbitrary ratio. Accordingly, when the XY stage 17 makes a step-operation in the x-axial direction, if the moment $M_z$ around the z-axis is distributed only to the lightly loaded actuators 2a and 2c, the load upon the actuators 2b and 2c can be decreased, thus motion-mode distribution avoiding saturation of the outputs of the actuators 2b and 2d can be realized. In equation (9), the motion-mode distribution parameter $h_z$, with the moment $M_z$ around the z-axis as "0" to the actuators 2b and 2d, can be easily calculated. The motion-mode distribution in this case is represented as follows. The other motion-mode distribution parameters $h_x$ and $h_y$ are "0".

$$\begin{bmatrix} F_{ha} \\ F_{hb} \\ F_{hc} \\ F_{hd} \end{bmatrix} = \begin{bmatrix} 0.100 & 0.433 & 0.2 \\ 0.430 & 0.047 & 0 \\ -0.100 & 0.567 & -0.2 \\ 0.571 & -0.047 & 0 \end{bmatrix} \begin{bmatrix} F_x \\ F_y \\ F_z \end{bmatrix} \quad (10)$$

Similarly, when the XY stage 17 performs a step operation in the y-axial direction, the moment $M_z$ around the z-axis is distributed only to the actuators 2b and 2c so as to reduce loads upon the actuators 2a and 2c that generate driving forces in the y-axis direction as the step operation. This realizes appropriate and effective motion-mode based control without actuator-output saturation. The motion-mode distribution in this case is:

$$\begin{bmatrix} F_{ha} \\ F_{hb} \\ F_{hc} \\ F_{hd} \end{bmatrix} = \begin{bmatrix} 0.100 & 0.433 & 0 \\ 0.430 & 0.047 & -0.286 \\ -0.100 & 0.567 & 0 \\ 0.571 & -0.047 & 0.286 \end{bmatrix} \begin{bmatrix} F_x \\ F_y \\ M_z \end{bmatrix} \quad (11)$$

The step & repeat operation of the XY stage 17 is made in the x-axial or y-axial direction. If it is made in the x-axial direction, the motion-mode distribution as represented by equation (10) is employed to reduce loads upon the actuators 2b and 2d that generate driving forces in the x-axial direction. On the other hand, if the step & repeat operation is made in the y-axial direction, the motion-mode distribution as represented by equation (11) is employed to reduce loads upon the actuators 2a and 2c that generate driving forces in the y-axial direction. In this manner, the motion-mode based control can be realized appropriately and effectively without actuator-output saturation, by changing the motion-mode distribution in accordance with the step-operation direction. Otherwise, during exposure, in any of the x-axial and y-axial directions, a step operation in another direction (in the y-axial direction if the step operation is made in the x-axial direction) is included to a certain degree in the main step operation. Accordingly, the motion-mode distribution equations can be more positively changed between equations (10) and (11), based on each step-operation direction. A device for changing the motion-mode distribution corresponds to switches 18 and 18' in the motion-mode distributors 11 and 11'in FIG. 2. The switches 18 and 18' are used to change the motion-mode distribution based on the status of the step & repeat operation of the XY stage 17. That is, if the XY stage 17 moves in the x-axial direction, calculators 11a and 11a' are selected, while if the XY stage 17 moves in the y-axial direction, calculators 11b and 11b' are selected.

Second Embodiment

To realize appropriate and effective motion-mode control without actuator-output saturation, in addition to changing the distribution ratio of the moment $M_z$ around the z-axial direction as described in the first embodiment, changing the distribution ratio of the x-axial and y-axial direction parallel-propulsive forces is available. In the general motion-mode distribution as represented by equation (9), if the motion-mode distribution parameter hx is "0", the distribution of the x-axial direction parallel-propulsive force $F_x$ to the actuators 2b and 2d that generate driving forces in the x-axial direction is not equally made. Similarly, the distribution of the y-axial direction parallel-propulsive force Fy is not equally made. This inequality is caused in the construction as shown FIGS. 2 and 4, where the center of gravity G of the table 8 does not correspond with the central point among the vibration damping units 1a to 1d. As the moment around the z-axis can be suppressed by increasing the distribution ratio to the actuators closer to the center of gravity G, the total sum of the driving-force signals to the respective actuators can be reduced to a minimum, thus an energy-saving motion-mode distribution can be realized. However, to suppress vibration of the table 8 due to a step operation of the XY stage 17, a large amount of parallel-propulsive force must be imparted in a direction opposite to the step-operation direction. In a motion-mode distribution having the "0" motion-mode parameter with the purpose of minimizing the energy consumption, the distribution ratio of the parallel-propulsive force to the actuators closer to the center of gravity G is increased, which may cause actuator-output saturation at the actuators, and disturb the motion-mode based control.

Regarding the motion-distribution of the x-axial and y-axial direction parallel-propulsive forces $F_x$ and $F_y$, it is desirable to distribute the x-axial direction parallel-propulsive force $F_x$ to the actuators 2b and 2d that generate driving forces in the x-axial direction, and to distribute the y-axial direction parallel-propulsive force $F_y$ to the actuators 2a and 2c that generate driving forces in the y-axial direction for the sake of dissolving actuator-output saturation. This motion-mode distribution can be realized by appropriately determining the motion-mode distribution parameters $h_x$ and $h_y$ in equation (9). The motion-mode distribution for distributing the parallel-propulsive forces to corresponding actuators is represented below. Note that the moment $M_z$ around the z-axis is also equally distributed to the actuators 2a to 2d.

$$\begin{bmatrix} F_{ha} \\ F_{hb} \\ F_{hc} \\ F_{hd} \end{bmatrix} = \begin{bmatrix} 0.150 & 0.500 & 0.118 \\ 0.500 & 0.143 & -0.118 \\ -0.150 & 0.500 & -0.188 \\ 0.500 & -0.143 & 0.188 \end{bmatrix} \begin{bmatrix} F_x \\ F_y \\ M_z \end{bmatrix} \quad (12)$$

According to this motion-mode distribution, the x-axial and y-axial direction parallel-propulsive forces $F_x$ and $F_y$ are equally distributed to the corresponding actuators. This avoids actuator-output saturation due to heavy loads on actuators closer to the center of gravity G.

Third Embodiment

Figure 3:
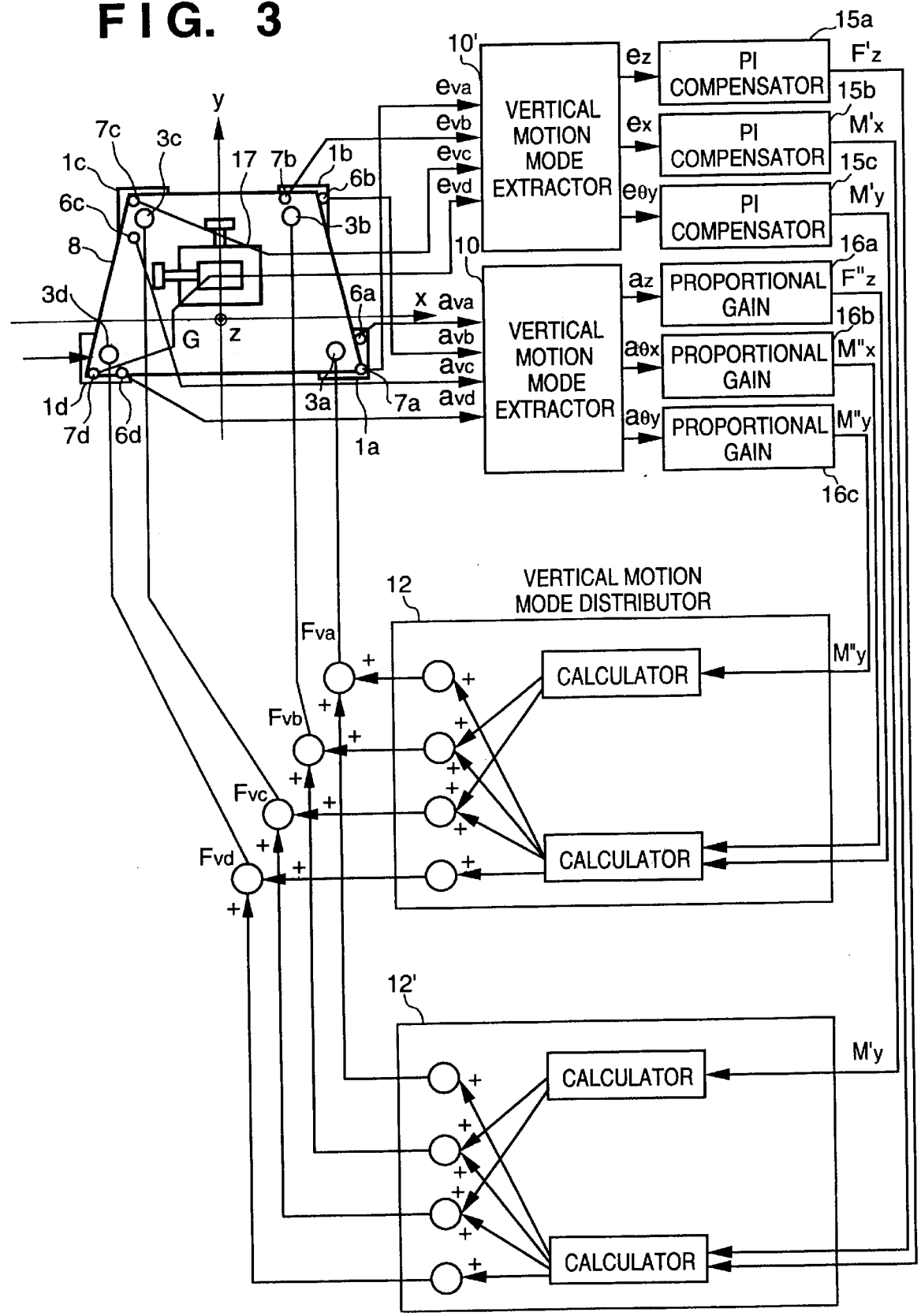
FIG. 3 is a block diagram showing a vertical vibration-damping structure of the vibration damping apparatus of a third embodiment.
Figure 5:
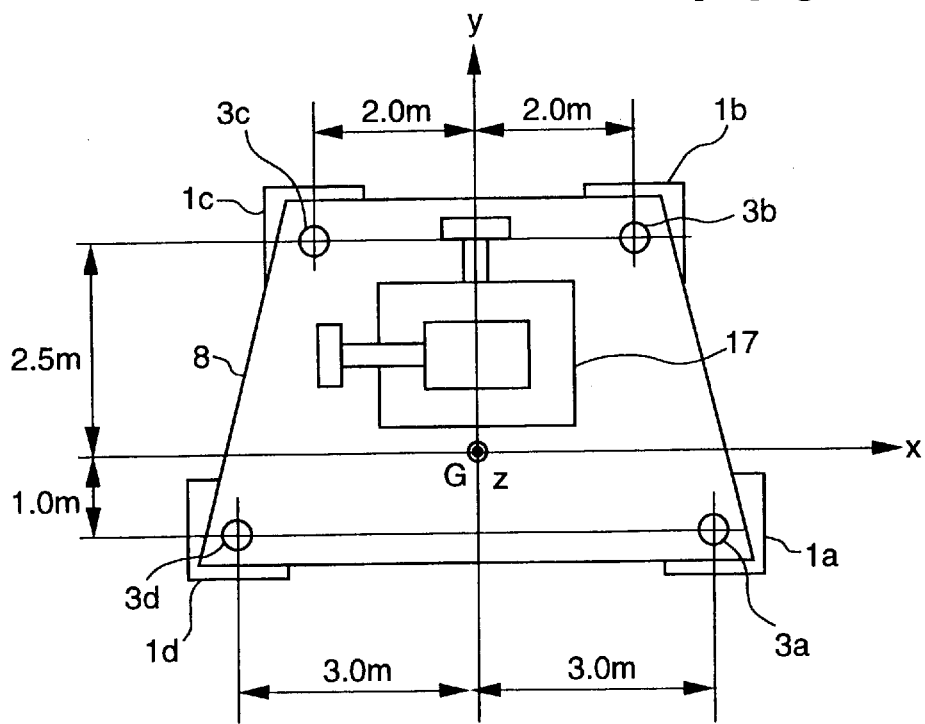
FIG. 5 is a schematic perspective view showing the arrangement of vertical actuators according to the third embodiment.

Next, a third embodiment in which the present invention is applied to vertical motion-mode based control will be described. FIG. 3 shows the construction of the vibration damping apparatus according to the third embodiment. FIG. 3 only shows elements related to the vertical motion modes. If the horizontal actuators 3a to 3d are provided close to the horizontal plane passing the center of gravity G of the table 8, the arrangement of the actuators 3a to 3d has almost no influence on the vertical motion modes. Accordingly, there are three vertical degrees of freedom, i.e., a vertical parallel-propulsive degree of freedom, and two rotational degrees of freedom around the two vertical orthogonal axis, which can be provided by the vertical actuators 3a to 3d and the vertical acceleration sensors 6a to 6d and the vertical position sensors 7a to 7d, with respect to the original six motion modes of the table 8. As shown in FIG. 3, if an orthogonal coordinate system is fixed on the table 8 so that the origin is set at the gravity G of the structure comprising the table 8 and the mounted device, the z-axis and the x-axis correspond with the vertical direction and the lengthwise direction of the table 8, respectively, so that the table 8 has three vertical degrees of freedom, i.e., a z-axial direction parallel-propulsive degree of freedom, and two rotational degrees of freedom around the x-axis and the y-axis. The respective actuators 3a to 3d generate driving forces in the z-axial direction. The distances between the point where the driving forces act on the table 8 and the x-axis and the y-axis are shown in FIG. 5.

At this time, the basic motion-mode distribution is represented by equation (13). In equation (13), motion-mode based table driving forces are $[F_z, M_x, M_y]^T \epsilon R^3$ and actuator driving-force signals are $[F_{va}, F_{vb}, F_{vc}, F_{vd}]^T \epsilon R^4$.

As the above-cited Japanese Patent Application Laid-Open No. 7-83276 uses a square table, the coefficient matrix of the motion-mode distribution basic representation in the vertical motion-mode based control comprises 1 or −1. The factors of the matrix vary based on the arrangement of the table 8 and the vibration damping units 1a to 1d. In equation (13), $F_z$ denotes a z-axial direction parallel-propulsive force; $M_x$ and $M_y$, moments around the x-axis and the y-axis; and $F_{va}, F_{vb}, F_{vc}$ and $F_{vd}$, driving-force signals to the vertical actuators 3a to 3d. The solution of equation (13) is represented by equation (14). In equation (14), $v_z$, $v_x$ and $v_y$ denote motion-mode distribution parameters used for deter mining motion-mode distribution by each of motion-mode based table driving forces $F_z$, $M_x$ and $M_y$.

$$\begin{bmatrix} 1 & 1 & 1 & 1 \\ 1 & 2.5 & 2.5 & -1.0 \\ -3.0 & -2.0 & -2.0 & 3.0 \end{bmatrix} \begin{bmatrix} F_{va} \\ F_{vb} \\ F_{vc} \\ F_{vd} \end{bmatrix} = \begin{bmatrix} F_z \\ M_x \\ M_y \end{bmatrix} \quad (13)$$

$$\begin{bmatrix} F_{va} \\ F_{vb} \\ F_{vc} \\ F_{vd} \end{bmatrix} = \begin{bmatrix} 0.375 - 2.0_{vz} & -0.143 - 2.0_{vx} & -0.115 - 2.0_{vy} \\ 0.143 + 3.0_{vz} & 0.143 + 3.0_{vx} & -0.077 + 3.0_{vy} \\ -0.143 - 3.0_{vz} & 0.143 - 3.0_{vx} & 0.077 - 3.0_{vy} \\ 0.357 + 2.0_{vz} & -0.143 + 2.0_{vx} & 0.115 + 2.0_{vy} \end{bmatrix} \begin{bmatrix} F_z \\ M_x \\ M_y \end{bmatrix} \quad (14)$$

Equations (13) and (14) can be applied to both of the vertical motion-mode distributors 12 and 12'. Therefore, the motion-mode based table driving forces $F_z$, $M_x$ and $M_y$ in equations (13) and (14) are replaced with the motion-mode based table driving forces $F''_z$, $M''_x$ and $M''_y$ regarding the accelerations or the motion-mode based table driving forces $F'_z$, $M'_x$ and $M'_y$ regarding the positions in the active vibration damping apparatus in FIG. 3. In this case, the actuator driving-force signals $F_{va}$ to $F_{vd}$ in equations (13) and (14) denote outputs from any of the vertical motion-mode distributors 12 and 12'. Actual driving-force signals to the actuators are sums of the outputs from both distributors. Motion-mode distribution can be independently determined with respect to the accelerations and positions. Otherwise, to simplify the construction of the active vibration damping apparatus, one of the motion-mode distributors can be omitted. In this case, the motion-mode based table driving forces $F_z$, $M_z$ and $M_y$ denote the sums between the motion-mode based table driving forces $F''_z$, $M''_x$, $M''_y$ regarding the accelerations and the motion-mode based table driving forces $F'_z$, $M'_x$ and $M'_y$ regarding the positions. The actuator driving-force signals $F_{va}$ to $F_{vd}$ are used as commands to the actuators. The above operations are corresponding to those in the first embodiment.

Considering the structural feature of the apparatus, the center of gravity G of the table 8 supported by the vibration damping units 1a to 1d does not always correspond with the central position among the vibration damping units 1a to 1d. As the table 8 is float-supported by the vibration damping units 1a to 1d to shut off vibration from the setting floor, the vertical actuators 3a to 3d must always generate vertical parallel-propulsive forces in proportion to the gravity. In a case wherein an asymmetrical structure where the center of gravity is offset as shown in FIG. 3 and 5 is supported, the vertical actuators 3a and 3d positioned closer to the center of gravity G constantly receive heavier loads. On the other hand, a step & repeat operation of the XY stage 17 on the table 8 causes rotational vibration around the x-axis and the y-axis. Therefore large damping moments must be acted upon the table 8 in these directions. At the actuators 3a and 3d, which are closer to the center of gravity G of the table 8, and which constantly receive heavy loads, there is a high probability of actuator-output saturation when receiving the damping moment. Therefore, it is desirable to lower the distribution ratio of the moments $M_x$ and $M_y$ around the x-axis and y-axis to the actuators 3a and 3d.

It is understood from the motion-mode distribution equation (14), the moment $M_y$ around the y-axis can be distributed to the pair of actuators 3a and 3d, and the pair of actuators 3b and 3c, at an arbitrary ratio. When the XY stage 17 performs a step & repeat operation mainly in the x-axial direction in FIG. 2, vibration around the y-axis is caused. Accordingly, actuator-output saturation when the XY stage 17 performs step & repeat operation mainly in the x-axial direction can be avoided by setting the distribution rate of the moment $M_y$ around the y-axis to the actuators 3a and 3d, closer to the center of gravity G and constantly receiving heavy loads, to a lower rate. This appropriately realizes the motion-mode based control. The motion-mode distribution of the moment $M_y$ around the y-axis only to the actuators 3b and 3c is represented by the following equation (15). The motion-mode distribution of the moment $M_y$ around the y-axis to the pair of actuators 3a and 3d, and the pair of actuators 3b and 3c, at the ratio of 2:1, is represented by the following equation (16). In these equations, the motion-mode distribution parameters $v_z$ and $v_x$ are "0" regarding the distribution of z-axial direction parallel-propulsive force Fx and the moment $M_x$ around the x-axis.

$$\begin{bmatrix} F_{va} \\ F_{vb} \\ F_{vc} \\ F_{vd} \end{bmatrix} = \begin{bmatrix} 0.375 & -0.143 & 0 \\ 0.143 & 0.143 & -0.250 \\ 0.143 & 0.143 & 0.250 \\ 0.357 & -0.143 & 0 \end{bmatrix} \begin{bmatrix} F_z \\ M_x \\ M_y \end{bmatrix} \quad (15)$$

$$\begin{bmatrix} F_{va} \\ F_{vb} \\ F_{vc} \\ F_{vd} \end{bmatrix} = \begin{bmatrix} 0.375 & -0.143 & -0.071 \\ 0.143 & 0.143 & -0.143 \\ 0.143 & 0.143 & 0.143 \\ 0.357 & -0.143 & 0.071 \end{bmatrix} \begin{bmatrix} F_z \\ M_x \\ M_y \end{bmatrix} \quad (16)$$

As described above, the present invention distributes a load to respective actuators without concentrating loads upon a portion of the actuators. This realizes appropriate and effective motion-mode based control.

As many apparently widely different embodiments of the present invention can be made without departing from the spirit and scope thereof, it is to be understood that the invention is not limited to the specific embodiments thereof except as defined in the appended claims.

What is claimed is:

1. A vibration damping apparatus comprising:

a vibration damping table;

an XY-stage mounted on said vibration damping table and capable of moving in X-axis and Y-axis directions on an X-Y plane of said vibration damping table;

a detector which detects at least one of deviation and acceleration;

an X-axis direction actuator which applies a driving force to said vibration damping table in the X-axis direction;

a Y-axis direction actuator which applies a driving force to said vibration damping table in the Y-axis direction; and motion-mode distribution means for generating a driving force command for said X-axis and Y-axis direction actuators by acquiring motion mode compensation signals of two parallel-propulsive degrees of freedom in a direction parallel to the X-Y plane and motion mode compensation signals of a rotational degree of freedom around a Z-axis, which is perpendicular to the X-Y plane, based on a detection signal produced by said detector, wherein said motion-mode distribution means outputs the driving force command corresponding to the compensation signal of the rotational degree of freedom so as to allocate a driving force corresponding to the compensation signal to said X-axis and Y-axis direction actuators in a different ratio.

2. The apparatus according to claim 1, wherein said detector comprises (i) a deviation detector which detects a deviation of said vibration damping table and (ii) an acceleration detector which detects acceleration of said vibration damping table, and said motion mode distribution means acquires the motion mode compensation signals based on a deviation detected by said deviation detector and an acceleration detected by said acceleration detector.

3. The apparatus according to claim 1, wherein said motion mode distribution means outputs the driving force command so as to allocate most of the driving force corresponding to the rotational degree of freedom to one of said X-axis and Y-axis direction actuators when said X-Y stage moves mainly in the X-axis direction, and outputs the driving force signal so as to allocate most of the driving force command corresponding to the rotational degree of freedom to the other of said X-axis and Y-axis direction actuators when said X-Y stage moves mainly in the Y-axis direction.

4. The apparatus according to claim 1, wherein said motion mode distribution means outputs the driving force signal so as to allocate all of the driving force corresponding to the rotational degree of freedom to one of said X-axis and Y-axis direction actuators when said X-Y stage moves mainly in the X-axis direction, and outputs the driving signal so as to allocate all of the driving force corresponding to the rotational degree of freedom to the other of said X-axis and Y-axis direction actuators when said X-Y stage moves mainly in the Y-axis direction.

5. A vibration damping apparatus comprising:

a vibration damping table;

an XY-stage mounted on said vibration damping stage and capable of moving in X-axis and Y-axis directions on an X-Y plane of said vibration damping table;

a detector which detects at least one of deviation and acceleration;

a plurality of actuators which apply a driving force to said vibration damping table in a Z-axis direction, which is perpendicular to the X-Y plane; and motion-mode distribution means for generating a driving force command for said plurality of actuators by acquiring motion mode compensation signals of two rotational degrees of freedom around the X-axis and Y-axis and motion mode compensation signals of a parallel-propulsive degree of freedom in the Z-axis direction, based on a detection signal detected by said detector, wherein said motion-mode distribution means outputs the driving force command so as to allocate a driving force, corresponding to the at least one of the compensation signals of the two rotational degrees of freedom, to said plurality of actuators so as to distribute a smaller proportion of the driving force to an actuator which is closer to a center of gravity of a structure comprising at least said vibration damping apparatus.

* * * * *

UNITED STATES PATENT AND TRADEMARK OFFICE
CERTIFICATE OF CORRECTION

PATENT NO. : 6,155,542
DATED : December 5, 2000
INVENTOR(S) : Hiroaki Kato et al.

Page 1 of 1

It is certified that error appears in the above-identified patent and that said Letters Patent is hereby corrected as shown below:

Title page,
Between Items [73] and [21], insert the following paragraph:
-- [*] Notice: This patent issued on a continued-prosecution application filed under 37 CFR 1.53 (d). And is subject to the twenty year patent term provisions of 35 U.S.C. 154 (a) (2). --.

Item [22], Filed,
"Mar. 10, 1997" should read -- Dec. 24, 1996 --.

Column 5,
Line 15, "quadruped" should read -- quadrupod --.

Column 13,
Line 48, "FIG. 3 and 5" should read -- FIGS. 3 and 5 --.

Signed and Sealed this

Twenty-ninth Day of January, 2002

*Attest:*

*Attesting Officer*

JAMES E. ROGAN
*Director of the United States Patent and Trademark Office*